(12) United States Patent
Yoshida et al.

(10) Patent No.: US 10,022,821 B2
(45) Date of Patent: Jul. 17, 2018

(54) BONDING METHOD AND BONDING DEVICE

(71) Applicant: KAIJO CORPORATION, Tokyo (JP)

(72) Inventors: Hikaru Yoshida, Tokyo (JP); Mizuho Shiroto, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 46 days.

(21) Appl. No.: 15/314,634

(22) PCT Filed: Apr. 28, 2015

(86) PCT No.: PCT/JP2015/062810
§ 371 (c)(1),
(2) Date: Nov. 29, 2016

(87) PCT Pub. No.: WO2016/021251
PCT Pub. Date: Feb. 11, 2016

(65) Prior Publication Data
US 2017/0190002 A1    Jul. 6, 2017

(30) Foreign Application Priority Data
Aug. 6, 2014 (JP) ................... 2014-160889

(51) Int. Cl.
*B23K 31/02* (2006.01)
*B23K 31/12* (2006.01)
(Continued)

(52) U.S. Cl.
CPC .......... *B23K 31/125* (2013.01); *B23K 20/005* (2013.01); *B23K 20/007* (2013.01); *B23K 31/02* (2013.01); *H01L 24/01* (2013.01)

(58) Field of Classification Search
CPC .... B23K 31/125; B23K 31/02; B23K 20/004; B23K 20/005; B23K 20/007; H01L 24/01; H01L 24/85; H01L 24/78
(Continued)

(56) References Cited

U.S. PATENT DOCUMENTS

| 4,564,734 | A | * | 1/1986 | Okikawa | B23K 20/007 |
|           |   |   |        |         | 219/56.22 |
| 4,909,427 | A | * | 3/1990 | Plaisted | B23K 20/007 |
|           |   |   |        |         | 219/56.21 |

(Continued)

FOREIGN PATENT DOCUMENTS

| JP | 59074640 A2 | 4/1984 |
| JP | 59094837 A2 | 5/1984 |

(Continued)

OTHER PUBLICATIONS

International Search Report dated Jul. 28, 2015 filed in PCT/JP2015/062810.

*Primary Examiner* — Kiley Stoner
(74) *Attorney, Agent, or Firm* — Rankin, Hill & Clark LLP

(57) ABSTRACT

To provide a wire bonding method and a wire bonding device capable of stably forming a free air ball having a large ball diameter while suppressing oxidation of the free air ball, in addition to supply of an oxidation prevention gas from gas supply means (10) into an insertion portion (32), an oxidation prevention gas is supplied from a gas supply nozzle (40), which is arranged outside the insertion portion (32), so as to cover an inlet of the insertion portion (32). Under a state in which a leading end of a wire (74) is positioned inside the insertion portion (32), and in which a leading end of a capillary (3) is positioned outside the insertion portion (32), spark discharge is generated. With this, a free air ball (Continued)

(75) having a large ball diameter can be formed while suppressing oxidation of the free air ball (75) and stabilizing the free air ball (75).

4 Claims, 11 Drawing Sheets

(51) Int. Cl.
*H01L 23/00* (2006.01)
*B23K 20/00* (2006.01)

(58) Field of Classification Search
USPC .................................. 228/180.5, 4.5, 904
See application file for complete search history.

(56) References Cited

U.S. PATENT DOCUMENTS

| | | | | | |
|---|---|---|---|---|---|
| 4,976,393 | A * | 12/1990 | Nakajima | ............ | B23K 20/007 219/56.21 |
| 4,998,002 | A * | 3/1991 | Okikawa | ............ | B23K 20/007 219/56.22 |
| 5,031,821 | A * | 7/1991 | Kaneda | ................ | B23K 20/007 228/110.1 |
| 6,234,376 | B1 * | 5/2001 | Wicen | ................ | B23K 20/007 219/56.22 |
| 2003/0019906 | A1 * | 1/2003 | Sakai | .................. | B23K 20/005 228/1.1 |
| 2004/0000577 | A1 * | 1/2004 | Nishiura | ............. | B23K 20/005 228/180.5 |
| 2004/0065720 | A1 * | 4/2004 | Wong | .................. | B23K 20/005 228/219 |
| 2005/0161488 | A1 * | 7/2005 | Duan | .................. | B23K 20/007 228/42 |
| 2008/0023028 | A1 * | 1/2008 | Fujita | .................. | B08B 7/0035 134/1.1 |
| 2010/0078464 | A1 * | 4/2010 | Nishiura | ............. | B23K 20/007 228/220 |
| 2011/0049219 | A1 * | 3/2011 | Huang | ................ | B23K 20/007 228/42 |
| 2013/0180757 | A1 * | 7/2013 | Uno | ........................ | H01L 23/48 174/126.2 |
| 2014/0151341 | A1 * | 6/2014 | Kuniyoshi | ............. | H01L 24/78 219/74 |
| 2014/0311590 | A1 * | 10/2014 | Maeda | .................... | H01L 24/78 137/334 |
| 2015/0209886 | A1 * | 7/2015 | Maeda | ................... | B23K 20/26 228/42 |
| 2015/0214180 | A1 * | 7/2015 | Sakakura | ................ | H01L 24/78 228/42 |

FOREIGN PATENT DOCUMENTS

| | | | | | |
|---|---|---|---|---|---|
| JP | | 2009105114 | A2 | 5/2009 | |
| JP | | 201140635 | | 2/2011 | |
| JP | | 2013058716 | A2 | 3/2013 | |
| WO | WO 2009072348 | A1 * | 6/2009 | ........... B23K 20/007 |

* cited by examiner (a)

(b)

BONDING METHOD AND BONDING DEVICE

TECHNICAL FIELD

The present invention relates to a wire bonding device using a copper wire, a silver wire, or the like, and more particularly, to a wire bonding device capable of forming a stable large ball at a leading end of a copper wire while suppressing oxidation.

BACKGROUND ART

With regard to an assembling step of a semiconductor, wire bonding using a gold wire is the mainstream method. However, there is an increase in employment of bonding using a copper wire which is less expensive in material cost as compared to the gold wire.

However, in the bonding using the copper wire, copper and oxygen react with each other during formation of a ball by spark discharge, with the result that a copper ball of copper oxide is formed. Copper oxide has a higher hardness as compared to copper. Thus, at the time of bonding of the copper ball and a pad of an IC chip, the copper oxide may cause damage under the pad.

Further, discoloration and eccentricity may occur in the oxidized copper ball to cause adverse effects on bonding quality. A ball formed at a leading end of a wire by spark discharge is called a free air ball (hereinafter referred to as "FAB").

In order to eliminate the adverse effects, it is necessary to prevent mixture of oxygen during a FAB forming step. Thus, in order to prevent oxidation of the ball, the FAB is formed mainly in an atmosphere of an inert gas, such as a nitrogen gas or an argon gas, or in an atmosphere of an oxidation-reduction gas, e.g., a nitrogen-hydrogen mixture gas. In the following, the inert gas and the oxidation-reduction gas are generically referred to as an oxidation prevention gas.

FIG. 11 is a perspective view for illustrating a positional relationship among a gas confining tube, a capillary, and a spark rod in a related-art wire bonding device. FIG. 12 is an explanatory view for illustrating a positional relationship among a capillary, a clamper, a gas discharging device including a spark rod, a jig tool, and the like of a wire bonding device in another related-art wire bonding device.

FIG. 11 is a perspective view for illustrating the capillary, the spark rod, and a periphery of those in the wire bonding device disclosed in Patent Literature 1. There is disclosed a wire bonding device configured to form a ball in an atmosphere of the oxidation prevention gas through use of the gas confining tube.

As illustrated in FIG. 11, the related-art wire bonding device disclosed in Patent Literature 1 includes a capillary 3 configured to draw out a copper wire 74 from a leading end 3a, a gas confining tube 85 having an upper opening 86 and a lower opening 87 formed so as to allow the leading end 3a of the capillary 3 to pass therethrough, and a spark rod 5 arranged in the gas confining tube 85 and configured to perform spark discharge with respect to a leading end portion 74a of the copper wire 74 drawn out from the leading end 3a of the capillary 3.

An atmosphere of the oxidation prevention gas is formed while allowing the oxidation prevention gas to flow through the gas confining tube 85, and spark discharge is performed through a leading end 5a of the spark rod 5 with respect to the leading end portion 74a of the copper wire 74, thereby forming the FAB.

As described above, in the related-art wire bonding device of FIG. 11, in order to prevent mixture of oxygen in the FAB forming step, while the oxidation prevention gas is allowed to flow through the gas confining tube 85, the leading end of the capillary 3 is inserted into the gas confining tube 85 through the upper opening 86, and spark discharge is performed through the leading end 5a of the spark rod 5 with respect to the leading end portion 74a of the copper wire 74 drawn out from the capillary 3, thereby forming the FAB in the atmosphere of the oxidation prevention gas.

Further, the applicant has proposed the invention of Patent Literature 2 according to FIG. 12 as another related-art bonding device.

FIG. 12 is an explanatory view for illustrating a positional relationship among the capillary, the clamper, and the gas discharging device including the spark rod (electric discharge electrode) in the wire bonding device described in Patent Literature 2. There is described a wire bonding device configured to form a ball in an atmosphere of the oxidation prevention gas through use of gas discharging tubes.

That is, as illustrated in FIG. 12, the related-art wire bonding device described in Patent Literature 2 includes a capillary 3 configured to draw out a copper wire 74 from a leading end, and a clamper 4 configured to clamp and release the wire 74 in conjunction with upward and downward movements of an ultrasonic horn 2 serving as a bonding arm.

Further, under the capillary 3, a gas discharging device 110 is arranged. In the gas discharging device 110, there are arranged a pair of gas discharging tubes including a first gas discharging tube 111 and a second gas discharging tube 120. The first gas discharging tube 111 has a cutout portion 111a formed at a leading end thereof so as to allow a leading end of the capillary 3 to be inserted therethrough, and is capable of discharging the oxidation prevention gas inside. The second gas discharging tube 120 has a cutout portion 120a formed at a leading end thereof, and is capable of discharging the oxidation prevention gas inside. The pair of gas discharging tubes is arranged so that the respective cutout portions 111a and 120a are opposed to each other. In the first gas discharging tube 111, a spark rod 5 is arranged. The respective cutout portions 111a and 120a arranged opposed to each other form an opening which allows insertion of the capillary 3 between the pair of gas discharging tubes.

Further, the first gas discharging tube 111a and the second gas discharging tube 120a have a gap between the respective leading ends, and the gas discharging device 110 includes position adjustment means 130 for adjusting a size of the gap.

Therefore, the wire 74 passes between clamping surfaces of an opening and closing mechanism of the clamper 4, passes through a hole formed in the capillary 3, and is drawn out from the leading end of the capillary 3. Further, under the capillary 3, the gas discharging device 110, which is capable of discharging the oxidation prevention gas inside, is arranged, and the gas discharging device 110 includes the spark rod 5. Thus, under a state in which both the leading end of the capillary 3 and the leading end of the wire 74 are inserted in the gas discharging device 110 through the respective cutout portions 111a and 120a of the first gas discharging tube 111 and the second gas discharging tube 120, that is, in the oxidation prevention gas atmosphere formed by the gas discharging device 110, a FAB 75 is formed at the leading end of the wire 74 by spark discharge.

CITATION LIST

Patent Literature

[PTL 1] U.S. Pat. No. 6,234,376 B1
[PTL 2] JP 2011-40635 A

SUMMARY OF INVENTION

Technical Problem

However, although the bonding devices illustrated in FIG. 11 and FIG. 12 are configured to form the FAB in the oxidation prevention gas atmosphere through use of the gas confining tube (85 in FIG. 11) or the gas discharging tubes (111 and 120 in FIG. 12) (those tubes are hereinafter generically referred to as "tube"), which allow the oxidation prevention gas to flow inside as described above, oxidation of the FAB may not be effectively prevented (or suppressed) in actuality.

A first factor which may hinder prevention of oxidation of the FAB is that an inflow of outside air containing oxygen (hereinafter simply referred to as "outside air") may destroy the oxidation prevention gas atmosphere inside the tube. That is, the oxidation prevention gas discharged inside the tube flows out to the outside of the tube through the openings which vertically pass through the tube for insertion of the capillary. The oxidation prevention gas having flowed out causes a turbulent flow and takes in the outside air present in the vicinity of the openings. Then, when the capillary moves upward and downward for a bonding operation in this state, the oxidation prevention gas having taken in the outside air present in the vicinity of the openings is forced to enter the tube by the capillary.

Further, the outside air may flow into the tube also by the ultrasonic horn 2 (see FIG. 12) in addition to the inflow by the capillary. With regard to the bonding devices illustrated in FIG. 11 and FIG. 12, a total length of the capillary is specified as 11.1 mm by the global standard. Thus, it is required that the ultrasonic horn connected to a base end portion of the capillary, a jig tool for conveyance and fixation of an IC device, and the tube be arranged close to each other within the specified total length. Therefore, the tube receives a piston effect from the adjacent ultrasonic horn 2, with the result that turbulence in flow of the oxidation prevention gas may occur inside the tube to cause the inflow of the outside air. As described above, the destruction of the oxidation prevention gas atmosphere inside the tube may cause oxidation of the FAB.

A second factor which may hinder prevention of oxidation of the FAB is that the FAB moves, during a forming step thereof, from the leading end side to the base end side of the capillary, that is, toward the opening formed in the upper surface of the tube for insertion of the capillary.

The FAB is formed through continuous melting of the leading end of the wire by spark discharge. Thus, along with a growth (increase in diameter), the FAB moves from a position at the start of the spark discharge toward the leading end side of the capillary. Therefore, at the time of completion of the spark discharge (at the time of completion of formation of the FAB), the FAB is positioned in the vicinity of the opening formed in the upper surface of the tube.

Due to the outside air taken in by the turbulent flow of the oxidation prevention gas in the vicinity of the opening, or due to the piston effect of the ultrasonic horn 2 as described above, the vicinity of the opening formed in the tube upper surface is in an atmosphere having an oxygen concentration which is relatively higher as compared to a center inside the tube (atmosphere having a low concentration of the oxidation prevention gas). Thus, the FAB may be oxidized in a final stage of the step of forming the FAB.

In particular, in a case where a FAB having a larger diameter is to be formed, a length of the wire to be melted becomes larger, and hence the amount of movement from the position at the start of the spark discharge becomes larger. Thus, an upper portion of the FAB (portion on the capillary leading end side) at the time of completion of the spark discharge may protrude through the opening formed in the upper surface of the tube, with the result that the FAB is further oxidized as compared to a FAB having a relatively small diameter.

As a matter of course, in a case where the tube has a sufficient thickness, or in a case where a FAB having a relatively small diameter is to be formed, formation of the FAB can be completed within a region inside the tube near a center of the tube where the oxygen concentration is low inside the tube.

However, the total length of the capillary is specified as described above. Thus, there is a limitation on an increase in thickness of the tube, and hence a size of the FAB which can be formed is limited. Such a fact implies that kinds of IC chips which can be bonded are limited.

It is an object of the present invention to provide a wire bonding method and a wire bonding device capable of stably forming a FAB having a large ball diameter while suppressing oxidation of the FAB.

Solution to Problem

In order to achieve the above-mentioned object, according to one embodiment of the present invention, there is provided a wire bonding method, including: arranging gas supply means including: an insertion portion which allows insertion of a capillary configured to draw out a wire from a leading end; and a gas supply port configured to supply an oxidation prevention gas to the insertion portion; inserting the wire through an inlet of the insertion portion to position a leading end of the wire inside the insertion portion; supplying the oxidation prevention gas under a state in which the leading end of the wire is positioned inside the insertion portion, and generating spark discharge between the wire and a spark rod arranged inside the insertion portion to form a free air ball at the leading end of the wire; bonding the wire to a substrate through intermediation of the free air ball; and supplying, simultaneously with the supplying of the oxidation prevention gas to the insertion portion, an oxidation prevention gas from a gas supply nozzle, which is arranged outside the insertion portion, so as to cover the inlet of the insertion portion, in which the spark discharge is generated under a state in which the leading end of the wire is positioned inside the insertion portion, and in which the leading end of the capillary is positioned outside the insertion portion.

Further, in the bonding method according to the one embodiment of the present invention, the spark discharge is performed until at least a part of the free air ball formed at the leading end of the wire is exposed to outside through the inlet of the insertion portion.

Further, in the bonding method according to the one embodiment of the present invention, the oxidation prevention gas is supplied to the insertion portion through a pair of gas supply ports arranged opposed to each other.

Further, in the bonding method according to the one embodiment of the present invention, the gas supply nozzle is configured to supply the oxidation prevention gas along a direction orthogonal to a direction in which the capillary is inserted.

Further, according to one embodiment of the present invention, there is provided a wire bonding device, including: a capillary configured to draw out a wire from a leading end; gas supply means including: an insertion portion which allows insertion of the capillary; and a gas supply port configured to supply an oxidation prevention gas to the insertion portion; moving means for moving the capillary and the gas supply means relative to each other; and a spark rod arranged inside the insertion portion, the wire bonding device being configured to: supply the oxidation prevention gas to the insertion portion under a state in which the wire is inserted through an inlet of the insertion portion to position a leading end of the wire inside the insertion portion; generate spark discharge between the spark rod and the wire to form a free air ball at the leading end of the wire; and bond the wire to a substrate through intermediation of the free air ball, in which the wire bonding device further includes a gas supply nozzle configured to supply the oxidation prevention gas so as to cover the inlet of the insertion portion from outside of the insertion portion, and in which the spark discharge is generated under a state in which the leading end of the wire is positioned inside the insertion portion, and in which the leading end of the capillary is positioned outside the insertion portion.

Further, in the bonding device according to the one embodiment of the present invention, the insertion portion includes a pair of gas supply ports arranged opposed to each other.

Further, in the bonding device according to the one embodiment of the present invention, the gas supply nozzle is configured to supply the oxidation prevention gas along a direction orthogonal to a direction in which the capillary is inserted.

Further, in the bonding device according to the one embodiment of the present invention, the gas supply means includes a flat surface portion having the inlet of the insertion portion, and the gas supply nozzle has a gas supply path formed so as to include the flat surface portion of the gas supply means and is configured to supply the oxidation prevention gas along the flat surface portion.

Advantageous Effects of Invention

According to the present invention, in addition to the supply of the oxidation prevention gas from the gas supply means to the inside of the insertion portion, the oxidation prevention gas is supplied from the gas supply nozzle, which is arranged outside the insertion portion, so as to cover the inlet of the insertion portion. Further, under the state in which the leading end of the wire is positioned inside the insertion portion, and in which the leading end of the capillary is positioned outside the insertion portion, the spark discharge is generated. With this, the FAB having a large ball diameter can be formed while suppressing oxidation of the FAB and stabilizing the FAB.

Further, according to the present invention, the oxidation prevention gas is supplied from the gas supply nozzle, which is arranged outside the insertion portion, so as to cover the inlet of the insertion portion, thereby being capable of performing the spark discharge until at least a part of the FAB formed at the leading end of the wire is exposed to outside through the inlet of the insertion portion. Therefore, oxidation of the FAB protruded through the inlet of the insertion portion can be prevented, and a large FAB which requires a large wire length can be formed in a stable state.

Further, even in a case where gas is taken into the insertion portion, the gas taken into the insertion portion itself is also the oxidation prevention gas supplied from the gas supply nozzle. Therefore, a FAB having a large ball diameter can be formed in a stable state without occurrence of the oxidation of the FAB.

BRIEF DESCRIPTION OF DRAWINGS

FIG. 10(*a*) is an illustration of the formation of the normal FAB in FIG. 9 (*a*), and FIG. 10 (*b*) is an illustration of the formation of the FAB having a large ball diameter in FIG. 9(*b*).

DESCRIPTION OF EMBODIMENTS

Now, with reference to the drawings, description is made of exemplary embodiments for carrying out a wire bonding method and a wire bonding device according to the present invention. In the wire bonding method and the wire bonding device according to the present invention, in addition to supply of an oxidation prevention gas from gas supply means to the inside of an insertion portion, the oxidation prevention gas is supplied from a gas supply nozzle, which is arranged outside the insertion portion, so as to cover an inlet of the insertion portion. Further, under a state in which a leading end of a wire is positioned inside the insertion portion, and in which a leading end of a capillary is positioned outside the insertion portion, spark discharge is generated. With this, a FAB having a large ball diameter can be formed while suppressing oxidation of the FAB and stabilizing the FAB.

[Summary of Device Configuration]

Figure 1:
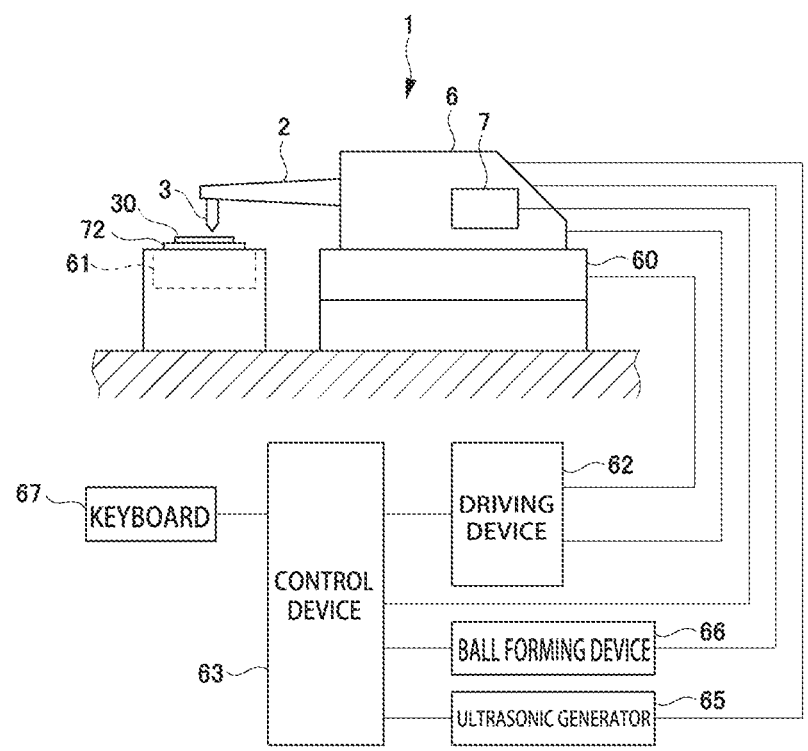
FIG. 1 is a block diagram for illustrating a configuration of a wire bonding device.
Figure 2:
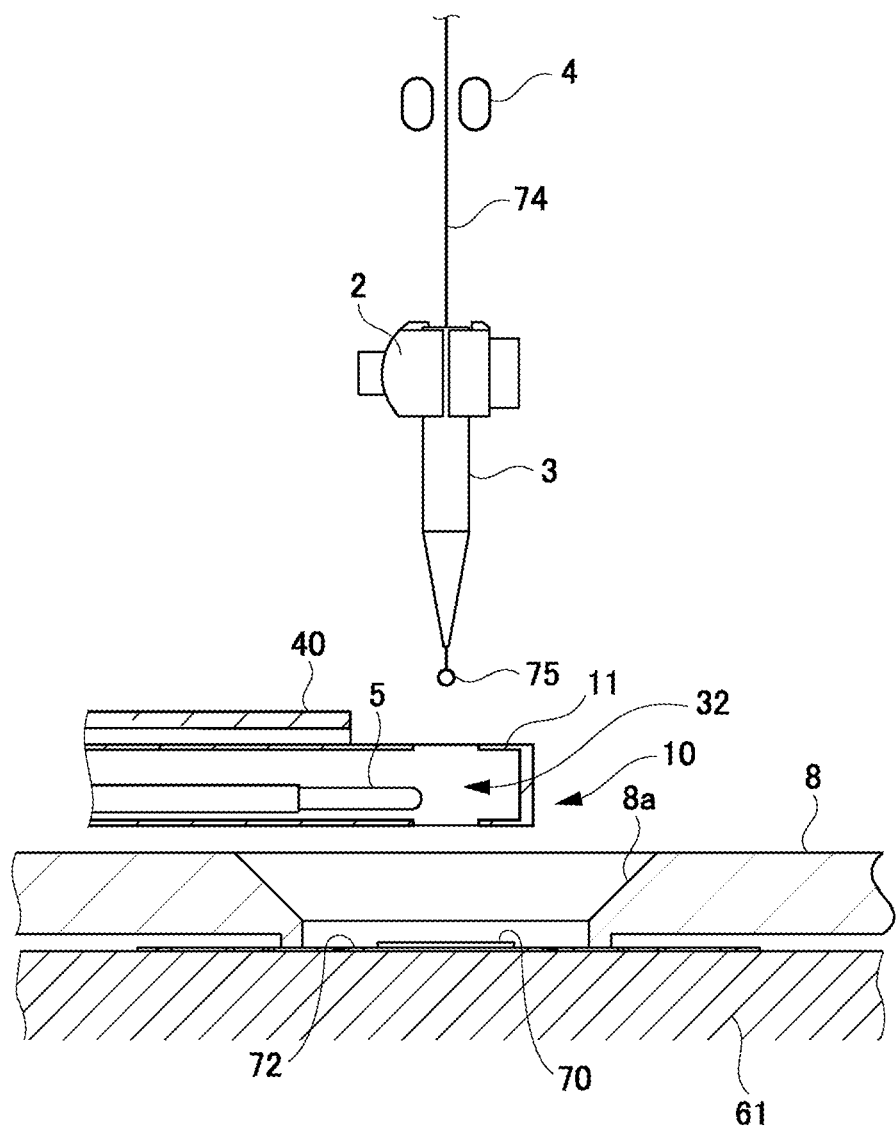
FIG. 2 is an explanatory view for illustrating a positional relationship among a capillary, a clamper, a gas discharging device including a spark rod, a jig tool, and the like in the wire bonding device.
Figure 3:
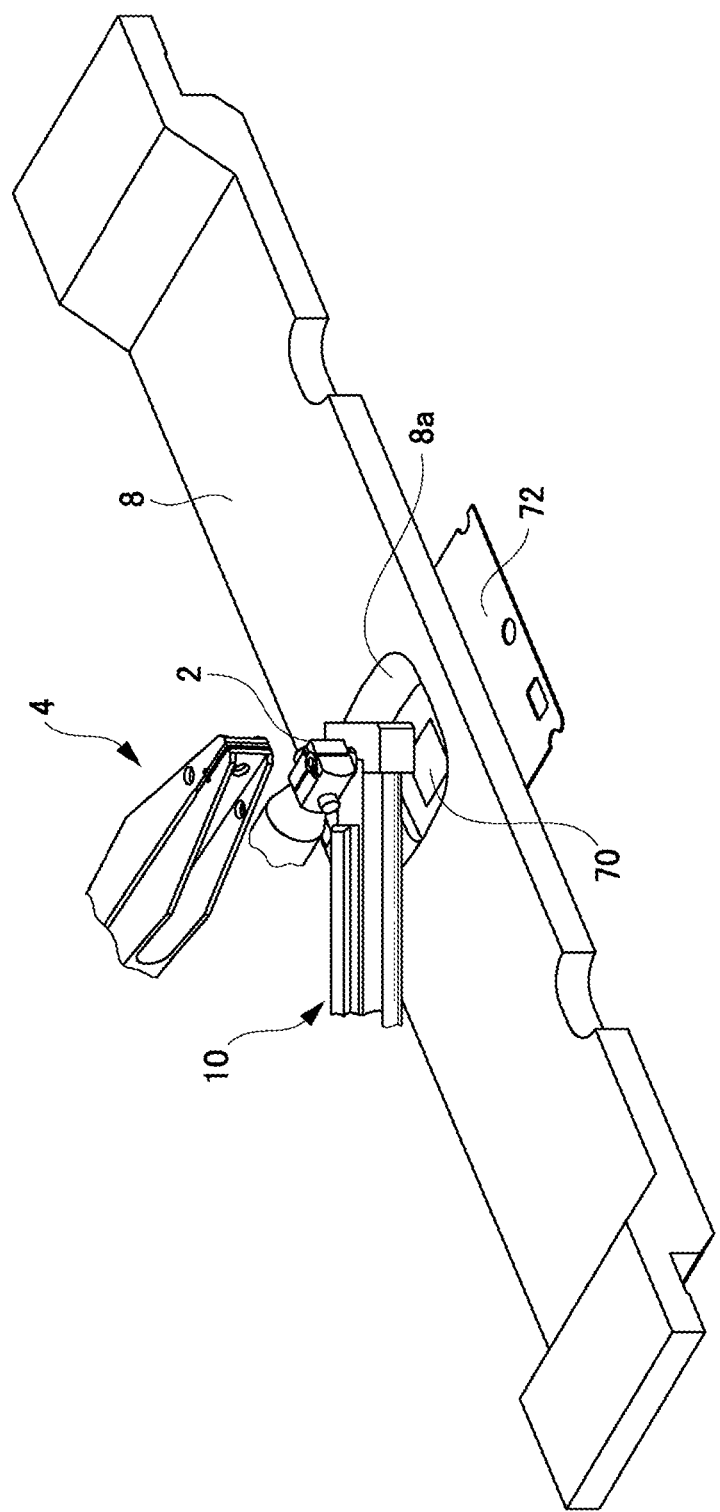
FIG. 3 is a perspective view for illustrating an actual positional relationship among the capillary, the clamper, the gas discharging device, a semiconductor chip, and a lead frame of FIG. 2.

First, a configuration of a wire bonding device is described with reference to FIG. 1 to FIG. 3. FIG. 1 is a block diagram for illustrating a configuration of the wire bonding device. FIG. 2 is an explanatory view for illustrating a positional relationship among a capillary, a clamper, a gas discharging device including a spark rod, a jig tool, and the like of the wire bonding device. FIG. 3 is a perspective view for illustrating an actual positional relationship among the capillary, the clamper, the gas discharging device, a semiconductor chip, and a lead frame of FIG. 2.

As illustrated in FIG. 1, a wire bonding device 1 includes a bonding arm 2 (ultrasonic horn 2) which is constructed by an ultrasonic horn including a capillary 3 serving as a bonding tool being mounted at a leading end, a bonding head 6 including a linear motor (not shown) serving as drive means for driving the bonding arm 2 in upward and downward directions, that is, a Z-direction, and an XY table 60 serving as XY positioning means having bonding means, which is constructed by the bonding arm 2 and the bonding head 6, mounted thereon, for positioning the bonding means through relative movement of the bonding means in a two-dimensional manner including an X-direction and a Y-direction, a heater portion 61 having a semiconductor chip 70 mounted thereon and including a heater plate on a stand where a bonding operation with the capillary 3, the bonding arm 2, and the bonding head 6 is performed, a control device 63 including a microcomputer configured to perform overall control of the wire bonding device 1, and a driving device 62 configured to transmit a drive signal to the bonding head 6 and the XY table 60 in accordance with a command signal from the control device 63.

A keyboard 67 is connected to the microcomputer of the control device 63 and configured to enable input of data, delivery of execution instruction, and the like. A storage device of the microcomputer of the control device 63 stores a program, and an operation such as wire bonding is performed through execution of the program.

Further, a lead frame 72 having the semiconductor chip 70 mounted thereon is mounted on the heater plate of the heater portion 61 and heated by a heater of the heater portion 61.

[Main Operation of Device]

The bonding head 6 configured to drive the bonding arm 2 upward and downward in the Z-direction includes a position detection sensor 7 configured to detect a position of the bonding arm 2. The position detection sensor 7 is configured to output, to the control device 63, a position of the capillary 3 mounted to a leading end of the bonding arm 2 from a predetermined original position of the bonding arm 2.

Further, the control device 63 controls the linear motor of the bonding head 6 to drive the bonding arm 2 upward and downward, and additionally controls a magnitude of a load and a time period for applying the load with respect to the capillary 3 during bonding.

Further, the wire bonding device 1 includes an ultrasonic generator 65. Voltage is applied to a vibrator incorporated in the ultrasonic horn 2 to generate vibration in the capillary 3 positioned at the leading end of the ultrasonic horn 2. With a control signal received from the control device 63, ultrasonic vibration can be applied to the capillary 3.

Further, formation of the ball at the leading end of the capillary 3 is performed through control of a ball forming device 66. The ball forming device 66 receives a control signal from the control device 63, and applies high voltage between a leading end of a wire drawn out from the capillary 3 as illustrated in FIG. 2 and a spark rod 5 (electric discharge electrode) included in gas discharging tubes 11 of a gas discharging device 10 (gas supply means) to generate spark discharge. The electric discharge energy of the spark discharge causes the leading end portion of the wire to be melted, thereby forming a ball at the leading end of the wire inserted in the capillary 3.

In the wire bonding device 1 illustrated in FIG. 1 to FIG. 3, while the lead frame 72 is heated under a state of being fixed by a jig tool 8 on the heater plate of the heater portion 61, a pad on the semiconductor chip 70 and a lead of the lead frame 72 or the like are connected with a wire by the capillary 3 through an opening portion 8a of the jig tool 8. The connection with the wire at the pad or the lead is performed by applying ultrasonic vibration and a load on the capillary 3 serving as a bonding tool.

As illustrated in FIG. 2 and FIG. 3, the jig tool 8 is configured to fix the lead frame 72 on the heater plate of the heater portion 61. When a semiconductor device constructed by the semiconductor chip 70 and the lead frame 72 is to be conveyed, the jig tool 8 moves upward to release the fixation of the lead frame 72. Thus, conveyance can be performed.

The capillary 3 positioned at a leading end of the bonding arm 2 of the bonding head 6 mounted to the XY table 60 is configured to be movable to a position on the XY axes by the XY table 60 and on the Z axis by the bonding head 6. However, the bonding head 6 may be fixed to a housing, and the heater portion 61 having bonded parts mounted thereon may be mounted on the XY table 60. Thus, the bonding head may perform only the upward and downward movements in the Z-axis direction, and the bonded parts may be mounted on the XY table and perform two-dimensional relative movements in the XY axes with respect to the capillary 3.

As illustrated in FIG. 2, a clamper 4 is configured to clamp and release a wire 74 by an opening and closing mechanism (not shown) in conjunction with the upward and downward movements of the bonding arm 2 (illustrated in FIG. 1), and is controlled by the control device 63.

The wire 74 passes between clamping surfaces of the opening and closing mechanism of the clamper 4, passes through a hole formed in the capillary 3, and is drawn out from the leading end of the capillary 3. Further, under the capillary 3, the gas discharging device 10, which serves as gas supply means for use in formation of a FAB in an oxidation prevention gas atmosphere formed by an oxidation prevention gas, is arranged.

The gas discharging device 10 includes the spark rod 5, and performs spark discharge under a state in which the leading end of the wire 74 is positioned inside the gas discharging device 10, to thereby form a FAB 75 at the leading end of the wire 74 drawn out from the leading end of the capillary 3.

The configuration of the wire bonding device illustrated in FIG. 1 to FIG. 3 is a general configuration, and the present invention is not limited thereto.

[Summary of Gas Discharging Device]

Figure 4:
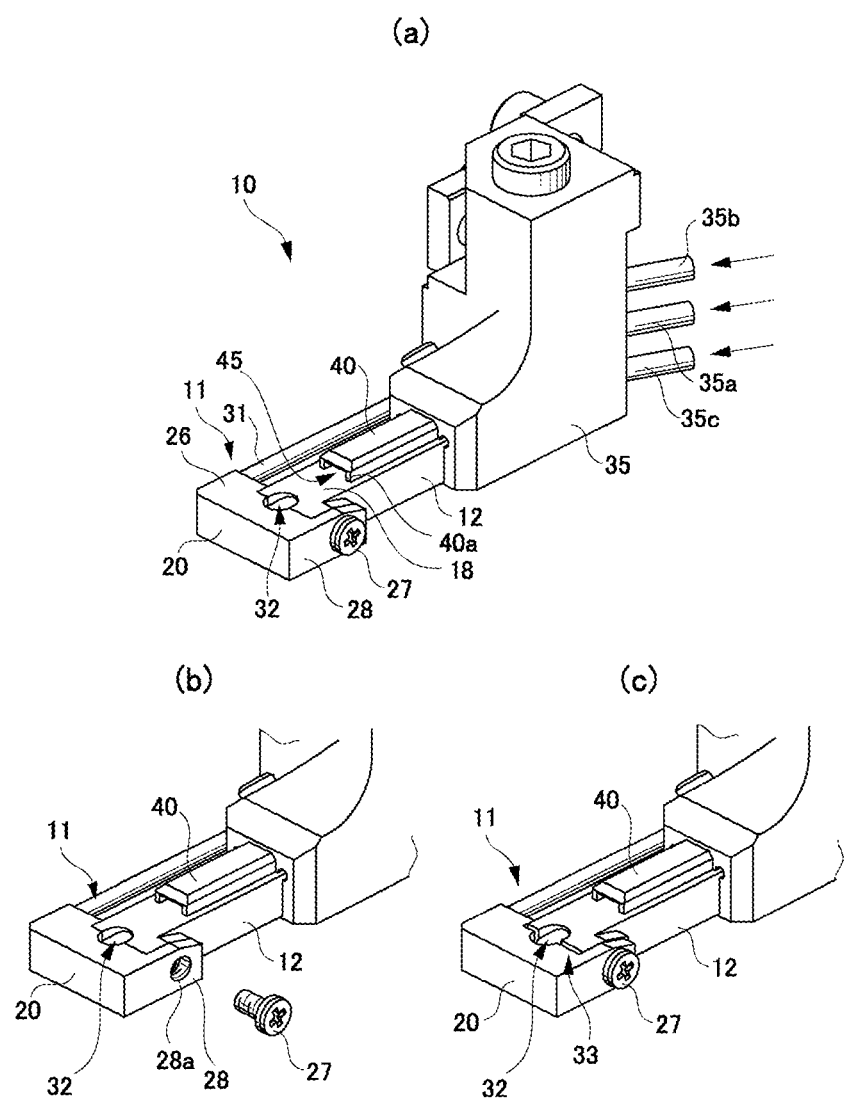
FIG. 4 are perspective views for illustrating a configuration of the gas discharging device, in which FIG. 4(*a*) is an overall perspective view, FIG. 4(*b*) is a partial perspective view for illustrating a state in which a bolt is removed, and FIG. 4(*c*) is a partial perspective view for illustrating a state in which a gap is expanded.
Figure 5:
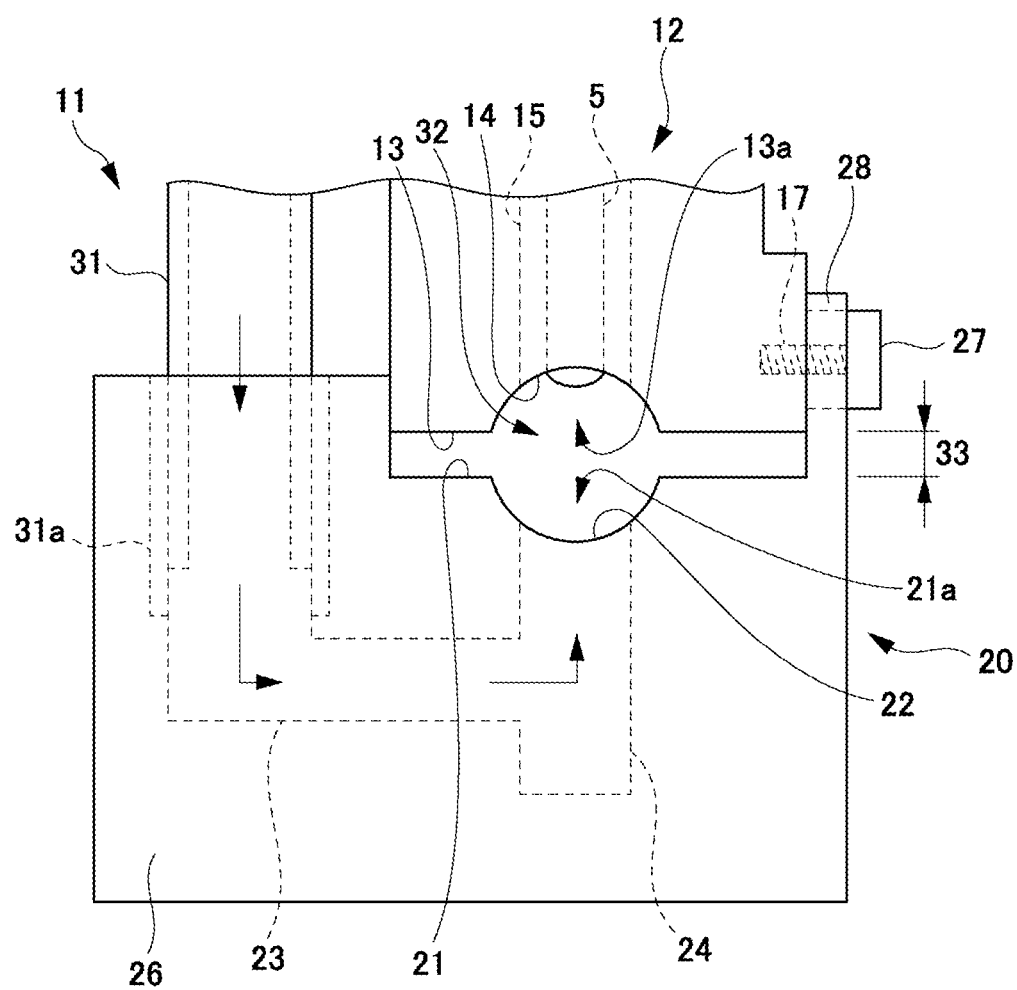
FIG. 5 is a partial plan view of a pair of gas discharging tubes.
Figure 6:
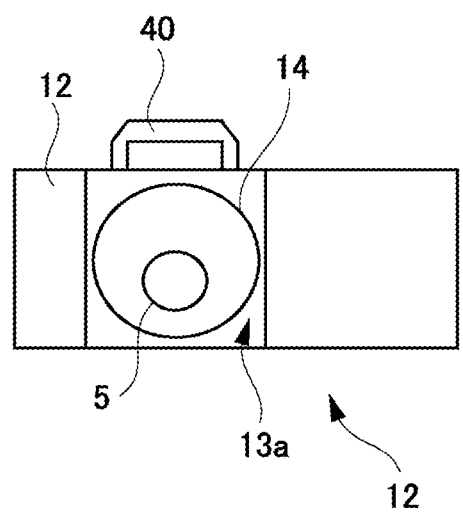
FIG. 6 are front views for illustrating a periphery of cutout portions of the pair of gas discharging tubes, in which FIG. 6(*a*) is a front view of a first gas discharging tube, and FIG. 6(*b*) is a front view for illustrating a second gas discharging tube.
Figure 6:
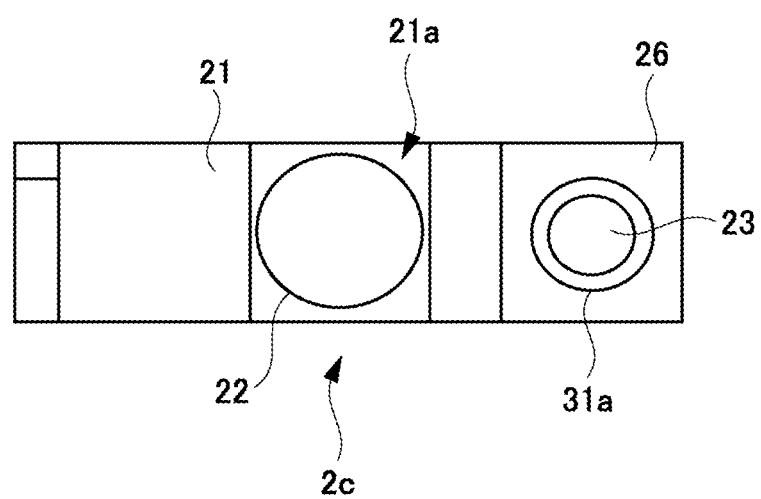

Next, with reference to FIG. 4 to FIG. 6, the gas discharging device is described in detail. The gas discharging device is mounted to the bonding head 6 (FIG. 1) through intermediation of amounting piece (not shown), and is configured to form the FAB in the oxidation prevention gas atmosphere formed by the oxidation prevention gas, to thereby stabilize the FAB while suppressing oxidation of the FAB. The atmosphere for prevention of oxidation is formed by the oxidation prevention gas. The atmosphere for prevention of oxidation to be formed by the oxidation prevention gas is hereinafter described as "oxidation prevention gas atmosphere."

FIG. 4 are perspective views for illustrating a configuration of the gas discharging device. FIG. 4(a) is an overall perspective view, FIG. 4(b) is a partial perspective view for illustrating a state in which a bolt is removed, and FIG. 4(c) is a partial perspective view for illustrating a state in which a gap is expanded. FIG. 5 is a partial plan view of a pair of gas discharging tubes. FIG. 6 are front views for illustrating a periphery of cutout portions of the pair of gas discharging tubes. FIG. 6 (a) is a front view of a first gas discharging tube, and FIG. 6 (b) is a front view for illustrating a second gas discharging tube.

As illustrated in FIG. 4 (a), the gas discharging device 10 includes the pair of gas discharging tubes 11. The pair of gas discharging tubes 11 is constructed by a first gas discharging tube 12 and a second gas discharging tube 20.

[Structure of First Gas Discharging Tube]

First, the first gas discharging tube 12 is described. As illustrated in FIG. 4 (a), FIG. 5, and FIG. 6 (a), the first gas discharging tube 12 has a hollow gas introduction hole 15 (see FIG. 5) configured to introduce the oxidation prevention gas inside, and includes, in the gas introduction hole 15, the spark rod 5 configured to perform spark discharge with respect to the wire drawn out from the capillary 3 (illustrated in FIG. 2) to form a ball.

Further, the first gas discharging tube 12 has an opening portion 13 at a leading end thereof, and the opening portion 13 has an arc-shaped cutout portion 13a to prevent contact with the leading end of the capillary 3 to be inserted.

Further, as illustrated in FIG. 5, a gas supply port 14 of the gas introduction hole 15 is located near a center of the opening portion 13. As illustrated in FIG. 5, the first gas discharging tube 12 is arranged so that a leading end 5a of the spark rod 5 provided in the gas introduction hole 15 slightly protrudes from a surface of the cutout portion 13a.

Further, a rear end of the first gas discharging tube 12 is fixed to a gas discharging tube retaining portion 35 illustrated in FIG. 4 (a), and has a gas inflow port (not shown) allowing an inflow of the oxidation prevention gas supplied from the gas discharging tube retaining portion 35.

In the gas discharging tube retaining portion 35, there is arranged a gas supply tube 35a in order to supply the oxidation prevention gas to the first gas discharging tube 12. The gas supply tube 35a communicates with the gas inflow port of the first gas discharging tube 12 inside the gas discharging tube retaining portion 35. The oxidation prevention gas is supplied from outside to the gas discharging tube retaining portion 35 as indicated by the arrow.

The inside of the first gas discharging tube 12 is formed so that the gas inflow port and the gas supply port 14 of the opening portion 13 communicate with each other through the gas introduction hole 15. The oxidation prevention gas supplied through the gas inflow port of the first gas discharging tube 12 passes through the gas introduction hole 15, flows along the outer periphery of the spark rod 5 and the gas introduction hole 15, and then is discharged through the gas supply port 14 to a space formed by the cutout portion 13a.

Further, as illustrated in FIG. 4 and FIG. 6 (a), the first gas discharging tube 12 further includes a tubular gas supply nozzle 40 on an upper surface side of the gas discharging tube 12. The gas supply nozzle 40 is configured to supply the oxidation prevention gas from the outside of the first gas discharging tube 12 so as to cover the cutout portion 13a exposed to the base end portion side of the capillary.

The gas supply nozzle 40 is arranged on a flat surface portion 18 (FIG. 4(a)) on the upper surface side of the first gas discharging tube 12. The configuration having the flat surface portion 18 formed from a discharge port 40a arranged in the vicinity of the cutout portion 13a to a periphery of the cutout portion 13a is utilized to enable supply of the oxidation prevention gas along the flat surface portion 18.

The gas supply nozzle 40 constructs a cylindrical path by closing, with the flat surface portion 18, an open portion of a gutter-like member having a substantially U-shaped section. With this, the gas supply nozzle 40 has a gas supply path 45 (FIG. 4(a)) as an internal space formed so as to include the flat surface portion 18, and is configured to supply the oxidation prevention gas along the flat surface portion 18 so as to cover the inlet of the insertion portion.

Further, a rear end of the gas supply nozzle 40 constructed to have a tubular shape is connected to the gas discharging tube retaining portion 35 as illustrated in FIG. 4(a), and hence the oxidation prevention gas is supplied from the gas discharging tube retaining portion 35. In the gas discharging tube retaining portion 35, there is arranged a gas supply tube 35b in order to supply the oxidation prevention gas to the gas supply nozzle 40. The gas supply tube 35b communicates with the discharge port 40a of the gas supply nozzle 40 inside the gas discharging tube retaining portion 35. The oxidation prevention gas is supplied from outside to the gas discharging tube retaining portion 35 as indicated by the arrow.

The first gas discharging tube 12 is made of ceramics, heat-resistant glass, glass epoxy resin, or the like exhibiting excellent insulation property and heat-resistant property. Further, the cutout portion 13a has an arc shape in plan view (FIG. 5) in order to prevent contact with the capillary 3. However, any of shapes such as a circular arc, oblique sides of a triangle, three sides of a rectangle, and a bottom side and oblique sides of a trapezoidal shape may be employed.

Further, the cutout portion 13a is formed equally with an arc shape in a vertical direction from an upper surface to a lower surface of the first gas discharging tube 12 in front view (FIG. 6(a)). However, as another configuration, the space formed by the cutout portion 13a may be substantially hemispherical by forming an arc-like curved shape with a vertical center portion cut out most in the first gas discharging tube 12. As described above, it is preferred that the cutout portion 13a have a shape which prevents turbulence in flow of the oxidation prevention gas to be discharged through the gas supply port 14.

Further, in order to evenly diffuse the oxidation prevention gas in the space of the cutout portion 13a, a diameter of the gas supply port 14 may be set larger than a diameter of the gas introduction hole 15 so as to gradually increase the diameter from the gas introduction hole 15 to the gas supply port 14. As the oxidation prevention gas, there may be used a nitrogen gas, a nitrogen-hydrogen mixture gas, or an argon gas.

[Structure of Second Gas Discharging Tube]

Next, the second gas discharging tube 20 of the pair of gas discharging tubes 11 is described. The second gas discharging tube 20 forms a pair with the first gas discharging tube 12.

As illustrated in FIG. 4(a), FIG. 5, and FIG. 6(b), the second gas discharging tube 20 is arranged at a position opposed to the opening portion 13 of the first gas discharging tube 12. As illustrated in FIG. 5, the second gas discharging tube 20 has a hollow gas introduction hole 24 configured to introduce the oxidation prevention gas inside, and has an opening portion 21 at a position opposed to the opening portion 13 of the gas discharging tube 12.

The opening portion 21 of the second gas discharging tube 20 has an arc-shaped cutout portion 21a in order to prevent contact with the leading end of the capillary 3. Further, as illustrated in FIG. 5 and FIG. 6(b), a gas supply port 22 of the gas introduction hole 24 is located near a center of the opening portion 21. The gas supply port 22 is arranged opposed to the gas supply port 14 of the first gas discharging tube 12 to form a pair of gas supply ports.

As illustrated in FIG. 5, on a side surface side of the second gas discharging tube 20, there is formed a gas inflow port 23 configured to allow an inflow of the oxidation prevention gas, and the gas introduction hole 24 allows communication between the gas inflow port 23 and the gas supply port 22 of the opening portion 21.

Further, a gas supply tube 31 configured to supply the oxidation prevention gas is connected to the gas inflow port 23 through intermediation of a connection portion 26. With regard to the connection between the gas inflow port 23 and the gas supply tube 31 at the connection portion 26, the connection portion 26 is formed so as to be slidable in an axial direction with respect to the gas supply tube 31 through intermediation of a seal ring 31a in order to have a variable distance between the opening portion 13 of the first gas discharging tube 12 and the opening portion 21 of the second gas discharging tube 20 (gap 33 (FIG. 5)).

Further, another end of the gas supply tube 31 is fixed to the gas discharging tube retaining portion 35 illustrated in FIG. 4(a). In the gas discharging tube retaining portion 35, there is arranged a gas supply tube 35c in order to supply the oxidation prevention gas to the gas supply tube 31. The gas supply tube 35c communicates with the another end of the gas supply tube 31 inside the gas discharging tube retaining portion 35. The oxidation prevention gas is supplied from outside to the gas discharging tube retaining portion 35 as indicated by the arrow.

The inside of the second gas discharging tube 20 is formed so that the gas inflow port 23 of the connection portion and the gas supply port 22 of the opening portion 21 communicate with each other through the gas introduction hole 24. Thus, the oxidation prevention gas supplied from the gas supply tube 31 flows along the gas introduction hole 24 from the gas inflow port 23 as indicated by the arrow in FIG. 5, and is discharged through the gas supply port 22 to the space formed by the cutout portion 21a.

The second gas discharging tube 20 is made of ceramics, heat-resistant glass, glass epoxy resin, or the like exhibiting excellent insulation property and heat-resistant property. Further, the cutout portion 21a has an arc shape in plan view (FIG. 5) in order to prevent contact with the capillary 3. However, any of shapes such as a circular arc, oblique sides of a triangle, three sides of a rectangle, and a bottom side and oblique sides of a trapezoidal shape may be employed.

Further, the cutout portion 21a is formed equally with an arc shape in the vertical direction from an upper surface to a lower surface of the second gas discharging tube 20 in front view (FIG. 6(b)). However, as another configuration, the space formed by the cutout portion 21a may be substantially hemispherical by forming an arc-like curved shape with a vertical center portion cut out most in the second gas discharging tube 20. As described above, it is preferred that the cutout portion 21a have a shape which prevents turbulence in flow of the oxidation prevention gas to be discharged through the gas supply port 22.

Further, in order to evenly diffuse the oxidation prevention gas in the space of the cutout portion 21a, a diameter of the gas supply port 22 may be set larger than a diameter of the gas introduction hole 24 so as to gradually increase the diameter from the gas introduction hole 24 to the gas supply port 22.

With regard to the oxidation prevention gas, generally, an inert gas is used for a silver wire, and an oxidation-reduction gas is used for a copper wire. Further, a wire obtained by coating a surface of a copper wire with palladium is less liable to be oxidized as compared to a copper wire with no coating (bare copper wire), and hence the use of the inert gas may suffice.

[Relationship between Pair of Gas Discharging Tubes]

Further, as illustrated in FIG. 5, the first gas discharging tube 12 and the second gas discharging tube 20 of the pair of gas discharging tubes 11 are separated from each other with a gap 33 between the respective opening portions 13 and 21.

As described above, the gas discharging tubes 11 are constructed by the first gas discharging tube 12 and the second gas discharging tube 20, and the opening portions are opposed to each other through intermediation of the leading end of the capillary 3. The opening portions 13 and 21 have arc-shaped cutout portions 13a and 21a, respectively, in order to prevent contact with the leading end of the capillary 3, thereby forming an insertion portion 32 enabling insertion of the capillary 3.

The insertion portion 32 formed by the arc-shaped cutout portions 13a and 21a of the first gas discharging tube 12 and the second gas discharging tube 20 has a size which enables the capillary 3 to pass therethrough without contact with the cutout portions 13a and 21a.

On the right and left of the respective opening portions 13 and 21, the gap 33 is formed. With this, a space having the oxidation prevention gas atmosphere is formed between the respective opening portions 13 and 21 of the first gas discharging tube 12 and the second gas discharging tube 20 of the gas discharging tubes 11.

Further, with the gap 33 formed on the right and left of the opening portions 13 and 21 of the first gas discharging tube 12 and the second gas discharging tube 20, the oxidation prevention gas discharged from the first gas discharging tube 12 and the second gas discharging tube 20 flows through the cutout portions 13a and 21a of the opening portions 13 and 21 and also through the gap 33, thereby being capable of forming a stable space for the oxidation prevention gas.

With regard to the gas discharging tubes 11 described above, description is made of the configuration in which the spark rod is provided in the first gas discharging tube 12 and the configuration in which the gas supply portion 40 is arranged. However, the spark rod may be provided in the second gas discharging tube 20 in place of the first gas discharging tube 12. Similarly, the gas supply portion 40 may be arranged in the second gas discharging tube 20.

[Structure of Position Adjustment Means]

Next, position adjustment means configured to change a distance between the respective opening portions of the pair of gas discharging tubes is described in detail with reference to FIG. 4. The position adjustment means is configured to change a distance between the respective opening portions of the pair of gas discharging tubes constructed by the first gas discharging tube and the second gas discharging tube.

As illustrated in FIG. 4 and FIG. 5, the position adjustment means is configured to couple the opening portion 13 of the first gas discharging tube 12 and the opening portion 21 of the second gas discharging tube 20 to be opposed to each other. The position adjustment means includes a female thread portion 17 (FIG. 5) formed in the first gas discharging tube 12, a protrusion piece 28 formed on the second gas discharging tube 20, an elongated hole 28a formed in the protrusion piece 28, and a bolt 27 to be screwed to the female thread portion 17.

In a side surface of the first gas discharging tube 12, the female thread portion 17 serving as the position adjustment means is formed. On a side surface of the second gas discharging tube 20, the protrusion piece 28 having the elongated hole 28a is formed. The bolt 27 is inserted through the elongated hole 28a and screwed to the female thread portion 17, thereby fixing the second gas discharging tube 20 to the first gas discharging tube 12.

Thus, as illustrated in FIG. 4(b) and FIG. 4(c), when the bolt 27 inserted through the elongated hole 28a is loosened, the second gas discharging tube 20 can slide in a horizontal direction.

Thus, the second gas discharging tube 20 is slid to determine a position so that the gap 33 (FIG. 5) between the opening portion 13 of the first gas discharging tube 12 and the opening portion 21 of the second gas discharging tube 20 has a predetermined length, and the bolt 27 is used to fix the first gas discharging tube 12 and the second gas discharging tube 20.

As described above, the position of the second gas discharging tube 20 is slid by the position adjustment means, thereby being capable of changing a size of the space formed by the opening portion 13 of the first gas discharging tube 12 and the opening portion 21 of the second gas discharging tube 20. With this, the space for the oxidation prevention gas atmosphere can be changed in accordance with a magnitude of an electric discharge current, thereby being capable of achieving an optimum electric discharge environment.

Further, the distance between the opening portions can be easily set in accordance with conditions such as a size of a wire and a size of the FAB. Thus, operation efficiency may be improved.

[Other Components]

Other components according to the present invention are described with reference to FIG. 7. FIG. 7(a) is a front view of the capillary, FIG. 7(b) is a side view of a state in which the capillary is mounted to the horn, and FIG. 7(c) is a partial sectional view of a center of the jig tool.

As illustrated in FIG. 7(a) and FIG. 7(b), the capillary 3 is grasped at a base end portion thereof located on an upper end side, and is fixed to the bonding arm 2 including an ultrasonic horn (hereinafter referred to as ultrasonic horn 2). A lower portion on another end side is formed into a tapered shape, and a leading end portion is used to perform connection of a wire at a pad or a lead through application of ultrasonic vibration and a load. As indicated by H1 in FIG. 7(a), a total length of the capillary 3 (total height in the drawing sheet of FIG. 7(a)) is specified as 11.1 mm by the global standard.

Figure 7:
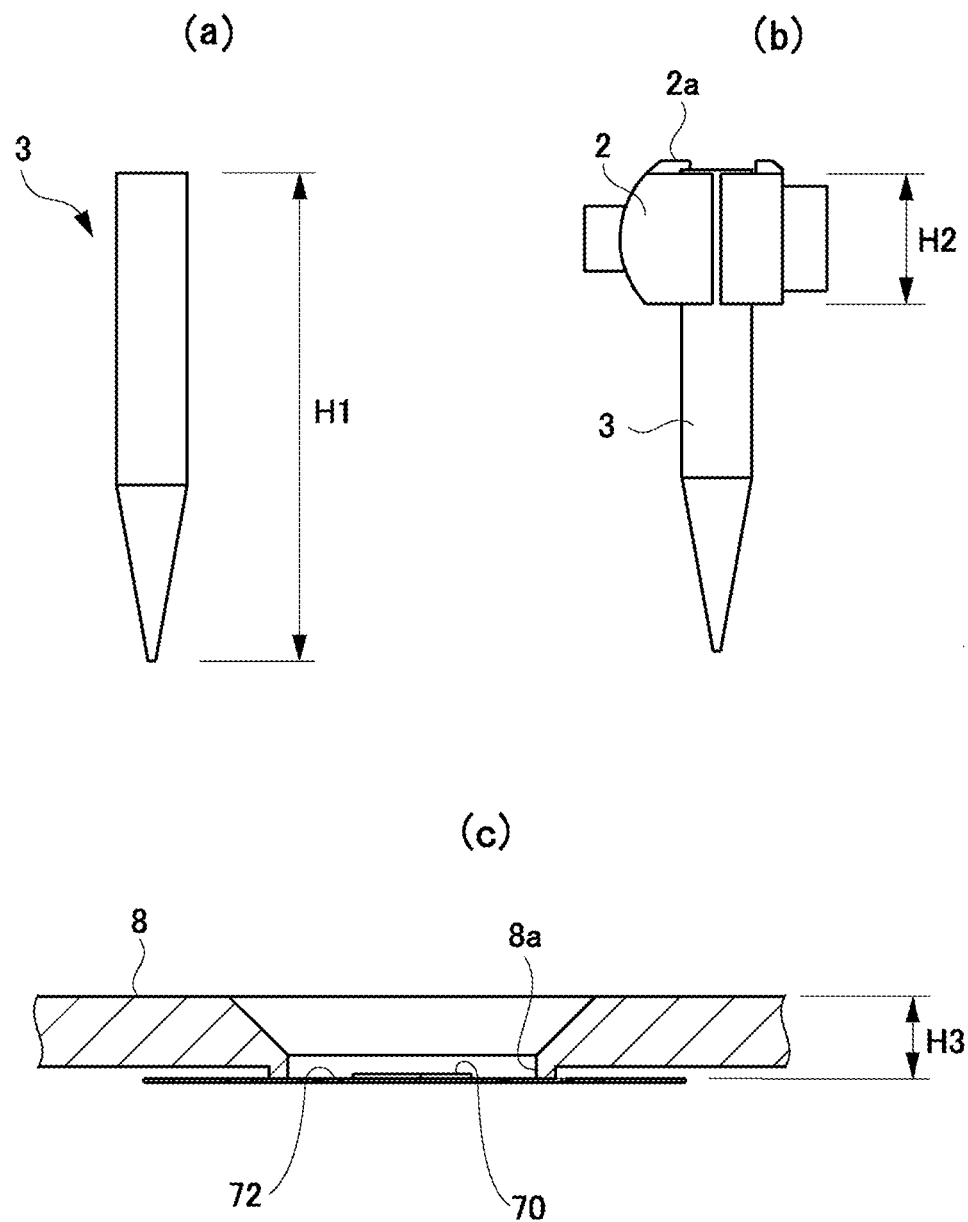
FIG. 7(*a*) is a front view of the capillary, FIG. 7(*b*) is a side view of a state in which the capillary is mounted to a horn, and FIG. 7(*c*) is a partial sectional view of a center of the jig tool.

Further, as illustrated in FIG. 7 (b), in order to amplify and transmit the ultrasonic vibration to the capillary 3, the ultrasonic horn 2 grasps the base end portion of the capillary 3 so that a leading end of the capillary 3 on the base end side is held in contact with a fixing piece 2a which is arranged so as to protrude from the ultrasonic horn 2, with the result that the capillary 3 is positioned and fixed to the ultrasonic horn 2.

Further, as illustrated in FIG. 7(c), the jig tool 8 is configured to fix the lead frame 72 on the heater plate of the heater portion 61.

[Total Height of Gas Discharging Device]

Figure 8:
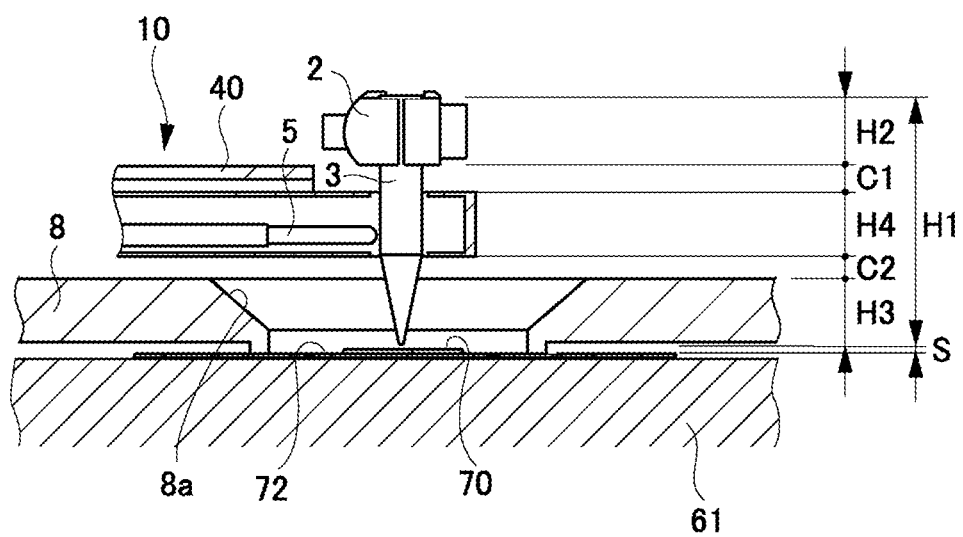
FIG. 8 is an explanatory side view for illustrating a positional relationship among the capillary, an ultrasonic horn, the jig tool, and the gas discharging device.

A total height of the gas discharging device 10 is inevitably set to a very small height of about 3.6 mm. Now, this point is described with reference to FIG. 7 and FIG. 8. FIG. 8 is an explanatory side view for illustrating a positional relationship among the capillary, the ultrasonic horn, the jig tool, and the gas discharging device.

That is, as illustrated in FIG. 7 and FIG. 8, the total height H1 of the capillary 3 is specified as 11.1 mm by the global standard. Thus, when a total height H4 of the pair of gas discharging tubes 11 of the gas discharging device 10 is to be determined, presence of the ultrasonic horn 2 having a total height H2 and the jig tool 8 having a total height of H3 in a periphery of the opening portion 8a needs to be taken into consideration to prevent interference with respect to those components.

Further, in order to prevent the interference of the ultrasonic horn 2 with respect to the pair of gas discharging tubes 11 and the interference with respect to the jig tool 8, a clearance needs to be formed between the components. Therefore, for example, even in a case where a minimum clearance of about 0.2 mm is set, there are formed a clearance C1 (0.2 mm) between the pair of gas discharging tubes 11 and the ultrasonic horn 2 and a clearance C2 (0.2 mm) between the pair of gas discharging tubes 11 and the jig tool 8 so that H1-C1-C2 is 11.1 mm-0.2 mm-0.2 mm=10.7 mm.

The pair of gas discharging tubes 11 (total height H4), the ultrasonic horn 2 (total height H2), and the jig tool 8 (total height H3 in a periphery of the opening portion 8a) need to be set within 10.7 mm. When the presence of the three components (11 (H4), 2 (H2), and 8 (H3)) is taken into consideration, and the total height of 10.7 mm within which the three components are to be set is divided by 3, there is provided 10.7 mm/3≈3.6 mm.

That is, in view of the fact that a sum of the total heights of the three components needs to be within 10.7 mm resulting from the total height H4 of the pair of gas discharging tubes 11 added to the ultrasonic horn 2 (total height H2) and the jig tool 8 (total height H3 in a periphery of the opening portion 8a), the total height H4 of the pair of gas discharging tubes 11 is calculated, for example, with 10.7 mm/3≈3.6 mm, to be about 3.6 mm. Thus, the pair of gas discharging tubes 11 needs to be formed very small.

FIG. 8 is an illustration of wire connection to the pad of the semiconductor chip 70, and a fine thickness (S) of the semiconductor chip 70 is also present. Thus, the clearance C1 is a clearance obtained through addition of a thickness S of the semiconductor chip 70 to the minimum clearance (for example, 0.2 mm).

Further, the capillary 3 connects the pad on the semiconductor chip 70 and the lead of the lead frame 72 with a wire, and hence it is also required to perform connection to a lead of the semiconductor chip 70 having no thickness. In that case, the capillary 3 further moves downward by the thickness S of the semiconductor chip 70 in FIG. 8.

Therefore, the gas discharging device is inevitably formed to be very small in the related-art bonding method and bonding device. Thus, in a case where a ball diameter of a desired FAB is large, even though the wire drawn out from the leading end of the capillary becomes longer, when a position of the FAB, which is formed in the vicinity of the leading end of the capillary through melting of the wire after the spark discharge, is outside the tube, the FAB is exposed to outside air and oxidized. Accordingly, formation of the FAB having a large diameter requiring a length of a wire to an extent that the FAB after the spark discharge is positioned outside the tubes was not able to be performed.

Therefore, as illustrated in FIG. 2 and FIG. 4, according to the present invention, the gas supply nozzle 40 is provided which is configured to supply the oxidation prevention gas from outside of the first gas discharging tube 12 so as to cover the inlet of the insertion portion 32 exposed to the base end portion side of the capillary 3. With this, the FAB 75 can be formed by a method in which the leading end of the wire 74 having been positioned inside the pair of gas discharging tubes 11 before the spark discharge is at least partially positioned outside the pair of gas discharging tubes 11 as the FAB 75 obtained through melting of the wire 74 after completion of the spark discharge. Consequently, the FAB 75 having a large ball diameter can be formed while suppressing oxidation of the FAB 75 and stabilizing the FAB 75.

[Operation of Forming FAB]

Figure 9:
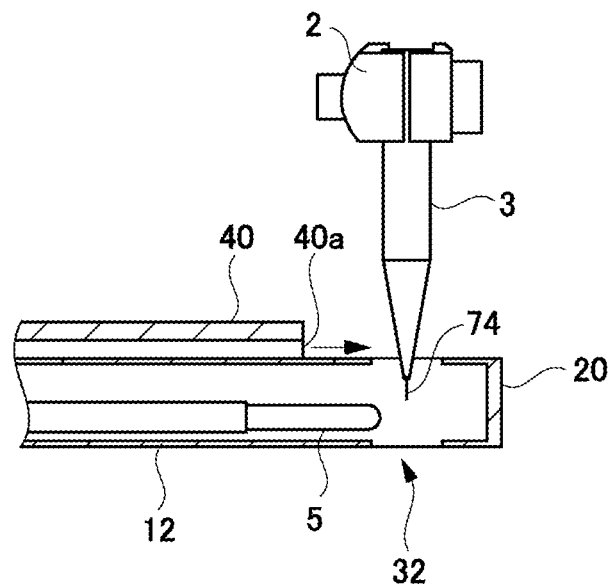
FIG. 9 are explanatory side views for illustrating formation of the FAB through use of the gas discharging device and illustrating a positional relationship between the capillary and the gas discharging device, in which FIG. 9 (*a*) is an illustration of formation of a normal FAB, and FIG. 9(*b*) is an illustration of formation of a FAB having a large ball diameter.
Figure 9:
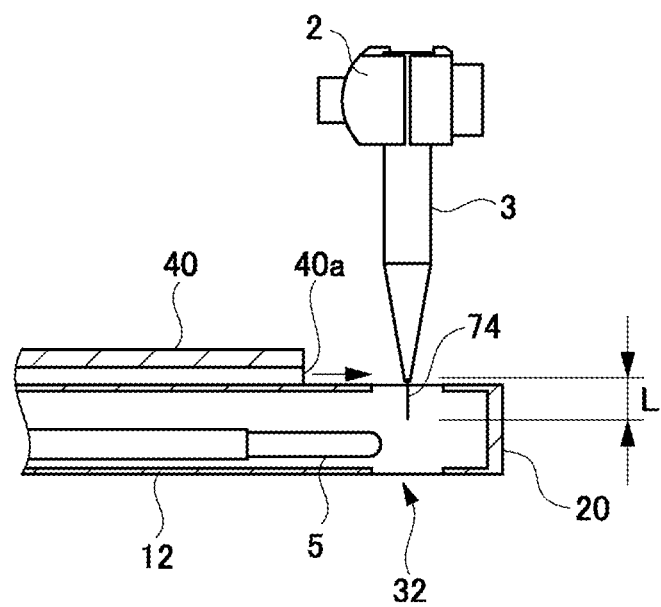
Figure 10:
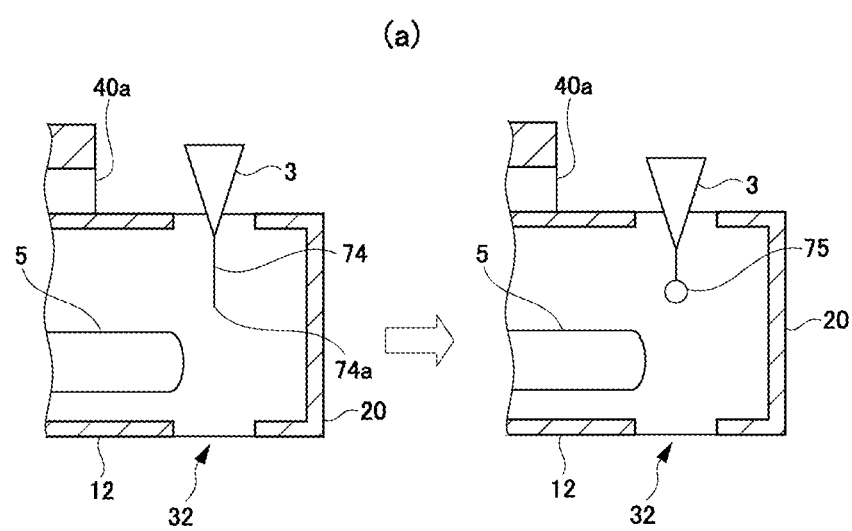
FIG. 10 are views for schematically illustrating the formation of the FAB in FIG. 9, in which the left side is an illustration before the spark discharge, and the right side is an illustration after the spark discharge.
Figure 10:
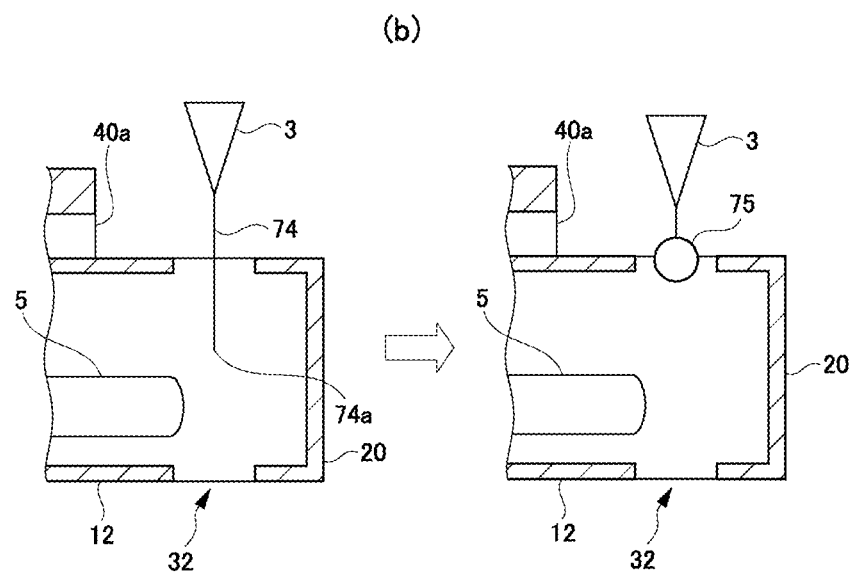
Figure 11:
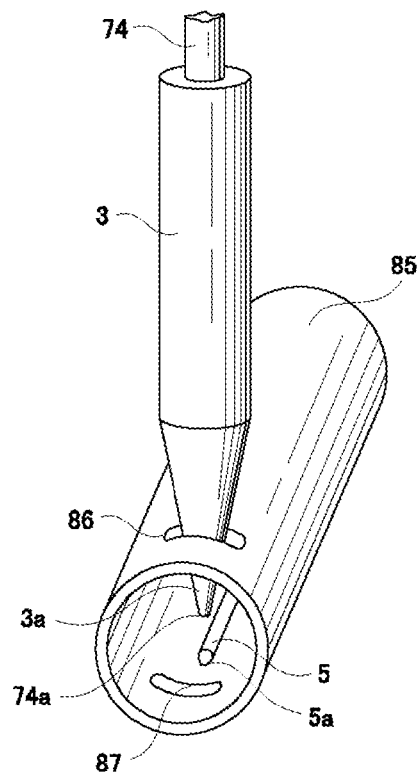
FIG. 11 is a perspective view for illustrating a positional relationship among a gas confining tube, a capillary, and a spark rod in a related-art wire bonding device.
Figure 12:
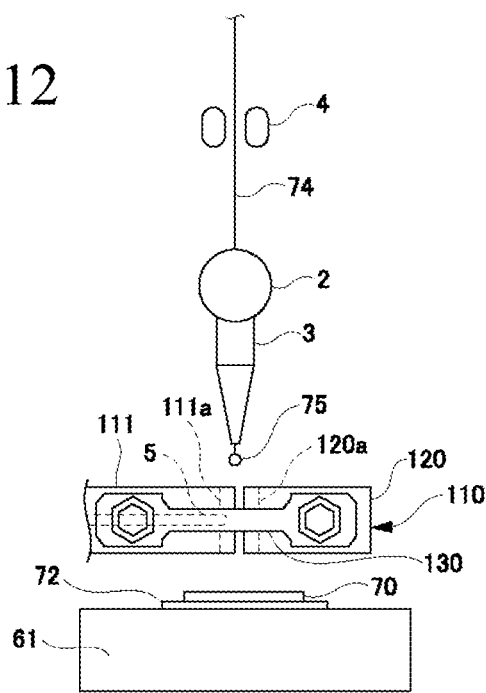
FIG. 12 is an explanatory view for illustrating a positional relationship among a capillary, a clamper, a gas discharging device including a spark rod, a jig tool, and the like in a wire bonding device of another related-art wire bonding device.

Next, with reference to FIG. 9 and FIG. 10, description is made of the formation of the FAB in the oxidation prevention gas atmosphere by the wire bonding method through use of the gas discharging device 10 according to the present invention. FIG. 9 are explanatory side views for illustrating the formation of the FAB through use of the gas discharging device and illustrating a positional relationship between the capillary and the gas discharging device. FIG. 9(a) is an illustration of formation of a normal FAB, and FIG. 9(b) is an illustration of the formation of the FAB having a large ball diameter. FIG. 10 are views for schematically illustrating the formation of the FAB in FIG. 9, in which the left side is an illustration before the spark discharge, and the right side is an illustration after the spark discharge. FIG. 10(a) is an illustration of the formation of the normal FAB in FIG. 9(a), and FIG. 10(b) is an illustration of the formation of the FAB having a large ball diameter in FIG. 9(b).

[Operation of Forming FAB (Normal FAB Formation)]

First, a normal FAB formation is described with reference to FIG. 5, FIG. 9(a), and FIG. 10(a). First, a length of the gap 33 between the opening portion 13 of the first gas discharging tube 12 and the opening portion 12 of the second gas discharging tube 20 is set by the position adjustment means of the pair of gas discharging tubes 11. The gap length is determined in accordance with a size of an electric discharge space based on the magnitude of the electric discharge current, an electrical discharge gap length between the wire leading end and the spark rod 5, and the like.

Further, before bonding is started, the oxidation prevention gas is supplied to the first gas discharging tube 12 and the second gas discharging tube 20. With this, the oxidation prevention gas atmosphere is formed in the space (insertion portion 32) between the opening portion 13 of the first gas discharging tube 12 and the opening portion 21 of the second gas discharging tube 20.

Further, the oxidation prevention gas is similarly supplied by the gas supply nozzle 40. With this, the inlet of the insertion portion 32 exposed on the base end portion side of the capillary 3 can be covered with the oxidation prevention gas, thereby being capable of preventing the outside air from being taken into the insertion portion 32 and the pair of gas discharging tubes 11.

In this case, it is preferred that a flow amount or a flow rate of discharge of the oxidation prevention gas from the first gas discharging tube 12, the second gas discharging tube 20, and the gas supply nozzle 40 be controlled so that the flow rates of the oxidation prevention gas are equal between the inside of the pair of gas discharging tubes 11 and the outside on the base end portion side of the capillary at the cutout portions 13a and 21a (inside of the pair of gas discharging tubes 11 and outside on the gas supply nozzle 40 side through intermediation of the insertion portion 32).

The flow rates of the oxidation prevention gas are equal between the inside of the pair of gas discharging tubes 11 and the outside of the pair of gas discharging tubes 11 on the gas supply nozzle 40 side through intermediation of the insertion portion 32, thereby being capable of suppressing the turbulent flow (intake) which may occur between the inside and outside of the pair of gas discharging tubes 11 through intermediation of the insertion portion 32.

Further, even in a case where the intake (turbulent flow) occurs, the turbulent flow occurs only under the atmosphere of the oxidation prevention gas from the pair of gas discharging tubes 11 and the oxidation prevention gas from the gas supply nozzle 40. Thus, the gas taken in by the turbulent flow itself is the oxidation prevention gas, and no oxidation of the FAB occurs, thereby being capable of forming the FAB having a large ball diameter in a stable state.

The supply of the oxidation prevention gas from the first gas discharging tube 12, the second gas discharging tube 20, and the gas supply nozzle 40 is performed at least during the spark discharge, thereby being capable of saving the amount of supply of the oxidation prevention gas.

Next, the capillary 3 is controlled so that the wire is drawn out by a required length from the leading end of the capillary 3, and then is moved to a position at which the spark discharge can be performed. With this, the leading end portion 74a of the wire 74 is positioned in the space (in the insertion portion 32) formed by the opening portions 13 and 21 of the pair of gas discharging tubes 11. In this case, during the formation of the normal FAB, the wire length required for the formation of the FAB is not required to be large, and hence the leading end of the capillary 3 is positioned in the insertion portion 32 similarly to the leading end 74a of the wire 74.

In order to stably perform the spark discharge, it is generally required that the leading end of the wire 74 be positioned above the leading end of the spark rod 5 to the extent possible. Therefore, while prevention of the interference between the spark rod 5 and the capillary 3 is taken into consideration, the leading end portion 74a of the wire 74 is arranged obliquely above the spark rod 5 so that the leading end portion 74a of the wire 74 is present relatively above the leading end of the spark rod 5.

The control device 63 (FIG. 1) controls the ball forming device 66 (FIG. 1) to apply a high voltage to the spark rod 5 provided in the pair of gas discharging tubes 11 and to the clamper 4 (FIG. 2), to thereby form the FAB 75 at the leading end portion 74a of the wire 74 by the spark discharge between the wire at the leading end of the capillary 3 and the spark rod 5 (FIG. 10 (a)).

In this case, as illustrated in FIG. 10 (a), the wire 74 is melted by the spark discharge, and hence the FAB 75 is formed as the leading end portion 74a of the wire 74 approaches to the leading end side of the capillary 3. The gas supply nozzle 40 supplies the oxidation prevention gas so as to cover the insertion portion 32, and hence the outside air is prevented from being taken into the insertion portion 32 and the pair of gas discharging tubes 11. With this, the FAB can be formed while suppressing oxidation of the FAB 75 and stabilizing the FAB 75.

[Operation of Forming FAB (Formation of FAB Having Large Ball Diameter)]

Next, the formation of the FAB having a large ball diameter is described with reference to FIG. 5, FIG. 9(b), and FIG. 10(b). First, a length of the gap 33 between the opening portion 13 of the first gas discharging tube 12 and the opening portion 21 of the second gas discharging tube 20 is set by the position adjustment means of the pair of gas discharging tubes 11. The gap length is determined in accordance with a volume of an electric discharge space, a discharging gap length between the wire leading end and the spark rod 5, and the like based on the magnitude of the electric discharge current.

Further, before the bonding is started, the oxidation prevention gas is supplied to the first gas discharging tube 12 and the second gas discharging tube 20. With this, the oxidation prevention gas atmosphere is formed in the space (insertion portion 32) between the opening portion 13 of the first gas discharging tube 12 and the opening portion 21 of the second gas discharging tube 20.

Further, the oxidation prevention gas is similarly supplied by the gas supply nozzle 40. With this, the inlet of the insertion portion 32 exposed to the base end portion side of the capillary 3 can be covered with the oxidation prevention gas, thereby being capable of preventing the outside air from being taken into the insertion portion 32 and the pair of gas discharging tubes 11.

In this case, it is preferred that the flow amount or the flow rate of discharge of the oxidation prevention gas from the first gas discharging tube 12, the second gas discharging tube 20, and the gas supply nozzle 40 be controlled so that the flow rates of the oxidation prevention gas are equal between the inside of the pair of gas discharging tubes 11 and the outside on the base end portion side of the capillary at the cutout portions 13a and 21a (inside of the pair of gas discharging tubes 11 and outside on the gas supply nozzle 40 side through intermediation of the insertion portion 32).

The flow rates of the oxidation prevention gas are equal between the inside of the pair of gas discharging tubes 11 and the outside of the pair of gas discharging tubes 11 on the gas supply nozzle 40 side through intermediation of the insertion portion 32, thereby being capable of suppressing the turbulent flow (intake) which may occur between the inside and outside of the pair of gas discharging tubes 11 through intermediation of the insertion portion 32.

Further, even in a case where the intake (turbulent flow) occurs, the turbulent flow occurs only under the atmosphere of the oxidation prevention gas from the pair of gas discharging tubes 11 and the oxidation prevention gas from the gas supply nozzle 40. Thus, the gas taken in the turbulent flow itself is the oxidation prevention gas, and no oxidation of the FAB occurs, thereby being capable of forming the FAB having a large ball diameter in a stable state.

The supply of the oxidation prevention gas from the first gas discharging tube 12, the second gas discharging tube 20, and the gas supply nozzle 40 is performed at least during the spark discharge, thereby being capable of saving the amount of supply of the oxidation prevention gas.

Next, the capillary 3 is controlled so that the wire is drawn out by a required length from the leading end of the capillary 3, and then is moved to the position at which the spark discharge can be performed. With this, the leading end portion 74a of the wire 74 is positioned in the space formed by the opening portions 13 and 21 of the pair of gas discharging tubes 11.

In this case, during the formation of the FAB having a large ball diameter, the wire length required for the formation of the FAB is large. Thus, unlike the leading end 74a of the wire 74, the leading end of the capillary 3 protrudes from the insertion portion 32 and is positioned outside the pair of gas discharging tubes 11.

In this case, in order to stably perform the spark discharge, it is generally required that the leading end of the wire 74 be positioned above the leading end of the spark rod 5 to the extent possible. Therefore, while prevention of the interference between the spark rod 5 and the capillary 3 is taken into consideration, the leading end portion 74a of the wire 74 is arranged obliquely above the spark rod 5 so that the leading end portion 74a of the wire 74 is present relatively above the leading end of the spark rod 5.

The control device 63 (FIG. 1) controls the ball forming device 66 (FIG. 1) to apply a high voltage to the spark rod 5 provided in the pair of gas discharging tubes 11 and to the clamper 4 (FIG. 2), to thereby form the FAB 75 at the leading end portion 74a of the wire 74 by the spark discharge between the wire at the leading end of the capillary 3 and the spark rod 5 (FIG. 10(b)).

In this case, as illustrated in FIG. 10(b), the wire 74 is melted by the spark discharge, and hence the FAB 75 is formed as the leading end portion 74a of the wire 74 approaches to the leading end side of the capillary 3. Therefore, during the formation of the FAB having a large ball diameter, the wire length required for the formation of the FAB is large, and hence at least a part of the FAB 75 formed after the spark discharge protrudes from the insertion portion 32 and is positioned outside the pair of gas discharging tubes 11.

However, the oxidation prevention gas is supplied by the gas supply nozzle 40 so as to cover the insertion portion 32, and the FAB 75 protruding from the insertion portion 32 is also exposed to the oxidation prevention gas, thereby being capable of forming the FAB having a large ball diameter while suppressing the oxidation of the FAB 75 and stabilizing the FAB 75.

When the lead frame 72 (FIG. 2) having the semiconductor chip 70 (FIG. 2) mounted thereon is to be automatically bonded, the FAB is formed at the leading end of the wire at a predetermined timing. The step of wire bonding is generally known, and hence description is omitted.

The present invention can be embodied in a large number of forms without departing from the essential characteristics thereof. Thus, the above-mentioned embodiment is exclusive for description, and it is to be understood that the present invention is not limited to the above-mentioned embodiment.

REFERENCE SIGNS LIST 1 wire bonding device
2 ultrasonic horn (bonding arm)
2a fixing piece
3 capillary (bonding tool)
3a leading end of capillary
4 clamper
5 spark rod (electric discharge electrode)
5a leading end of spark rod
6 bonding head 7 position detection sensor
8 jig tool
8a opening portion
10 gas discharging device (gas supply means)
11 pair of gas discharging tubes
12 first gas discharging tube
13 opening portion
13a cutout portion
14 gas supply port
15 gas introduction hole
17 female thread portion
18 flat surface portion
20 second gas discharging tube
21 opening portion
21a cutout portion
22 gas supply port
23 gas inflow port
24 gas introduction hole
27 bolt
28 protrusion piece
28a elongated hole
31 gas supply tube
31a seal ring
32 insertion portion
33 gap
35 gas discharging tube retaining portion
35a gas supply tube
35b gas supply tube
35c gas supply tube
40 gas supply nozzle
40a discharge port
45 gas supply path
60 XY table
61 heater portion
62 driving device
63 control device
65 ultrasonic generator
66 ball forming device
67 keyboard
70 semiconductor chip (IC chip)
72 lead frame
74 wire (copper wire)
74a leading end portion
75 free air ball (FAB)
110 gas discharging device
111 first gas discharging tube
111a cutout portion
120 second gas discharging tube
120a cutout portion
130 position adjustment means

The invention claimed is:

1. A wire bonding method, comprising:
arranging gas supply means including:
an insertion portion which allows insertion of a capillary configured to draw out a wire from a leading end; and
a gas supply port configured to supply an oxidation prevention gas to the insertion portion;
inserting the wire through an inlet of the insertion portion to position a leading end of the wire inside the insertion portion;
supplying the oxidation prevention gas under a state in which the leading end of the wire is positioned inside the insertion portion, and generating spark discharge between the wire and a spark rod arranged inside the insertion portion to form a free air ball at the leading end of the wire;
bonding the wire to a substrate through intermediation of the free air ball; and
supplying, simultaneously with the supplying of the oxidation prevention gas to the insertion portion, an oxidation prevention gas from a gas supply nozzle, which is arranged outside the insertion portion, so as to cover the inlet of the insertion portion,
wherein the spark discharge is generated under a state in which the leading end of the wire is positioned inside the insertion portion, and in which the leading end of the capillary is positioned outside the insertion portion.

2. A bonding method according to claim 1, wherein the spark discharge is performed until at least a part of the free air ball formed at the leading end of the wire is exposed to outside through the inlet of the insertion portion.

3. A bonding method according to claim 1, wherein the oxidation prevention gas is supplied to the insertion portion through a pair of gas supply ports arranged opposed to each other.

4. A bonding method according to claim 1, wherein the gas supply nozzle is configured to supply the oxidation prevention gas along a direction orthogonal to a direction in which the capillary is inserted.

* * * * *